United States Patent [19]

Foss et al.

[11] 3,911,465

[45] Oct. 7, 1975

[54] MOS PHOTODIODE

[76] Inventors: Norman A. Foss, Richmond Hill Road, Weston, Conn. 06880; Samuel A. Ward, 63 Florence Road, Riverside, Conn. 06878

[22] Filed: Mar. 6, 1974

[21] Appl. No.: 448,770

Related U.S. Application Data

[60] Division of Ser. No. 384,922, Aug. 2, 1973, which is a continuation of Ser. No. 144,002, May 17, 1971, abandoned.

[52] U.S. Cl. ........................ 357/23; 357/30; 357/52; 357/54

[51] Int. Cl.$^2$ ........................ H01L 27/14; H01L 29/78; H01L 31/00

[58] Field of Search .................... 357/23, 30, 52, 54

[56] References Cited

UNITED STATES PATENTS

| | | | |
|---|---|---|---|
| 3,523,190 | 8/1970 | Goetzberger | 250/211 |
| 3,562,425 | 2/1971 | Poirier | 178/7.2 |
| 3,631,308 | 12/1971 | Krolikonski | 317/235 |
| 3,696,276 | 10/1972 | Boland | 317/235 R |
| 3,760,242 | 9/1973 | Duffy | 317/235 R |

OTHER PUBLICATIONS

Pool et al., *J. Electrochem. Soc.*, Mar. 1967, pp. 266–267.

*Primary Examiner*—Martin H. Edlow

[57] ABSTRACT

A photodetector which comprises an MOS structure having a very small non-obscuring front contact, in the form of a dot or ring, plus the usual ohmic contact to the semi-conductor body. The device is adapted to be reverse-biased to give a wide depletion range, and an inversion layer at the semiconductor-insulator interface conducts electrons along the surface from the point of generation by absorption of photons to the region of the front contact. The device has a relatively large light-sensitive area, exhibits fast response time, and has a spectral characteristic of high quantum efficiency over the range of about 0.2 to 1.1 microns wavelength.

10 Claims, 4 Drawing Figures

MOS PHOTODIODE

This is a division of application Ser. No. 384,922, filed Aug. 2, 1973, which was a continuation of application Ser. No. 144,002 filed May 17, 1971 and now abandoned.

BACKGROUND OF THE INVENTION

This invention relates to photodetection by means of a semiconductor device, and more particularly by devices of the metal-oxide-semiconductor (MOS) type.

The photo-sensitivity of semiconductor devices is well known and relatively well understood. The detection of light using a semiconductor device is based upon the generation of hole-electron parts by the light absorbed within the semiconductor bulk giving rise to a photo voltage or a photocurrent in a PN junction structure. Commercially available solid state photodetectors are primarily of the junction type; i.e., P-N, P-I-N, or transistor (P-N-P, N-P-N). These devices, because their construction precludes optimum photon absorption, inherently have limited performance. Before they can reach the region of useful absorption in a large area junction type detector, the photons must first pass through a "dead" region where useless absorption takes place.

BRIEF DESCRIPTION OF THE INVENTION

This difficulty is obviated by the present invention by using a metal-oxide-semiconductor (MOS) type of photodetector, the semiconductor body of which is processed in a manner to form a highly conductive region (inversion layer) at the semiconductor-oxide interface. This feature of the semiconductor body permits the use of a single, relatively small front contact, in the form of a dot or non-obscuring ring, for example, which, in turn, allow incident photons to impinge directly onto and to pass with negligible loss through the transparent insulator to be directly absorbed in the region of useful absorption of the semiconductor. The back contact is made directly to the semiconductor body. Electrons excited by photons absorbed in the semiconductor are conducted along the inversion layer at the surface of the semiconductor to the region of the contact where they are transported by a conductive process through the insulator to the metal contact. The device is of simple construction, reproducible in production, exhibits a fast response time, and has a spectral chracteristic of high quantum efficiency over the range of about 0.2 to 1.1 microns wavelength. The sensitive area of the detector can be quite large, limited by the desired frequency response, and its noise is low, making it useful for detecting low light levels.

Superficially, the device resembles the MOS photodetector described in U.S. Pat. No. 3,523,190, which comprises a semiconductor body having on one surface thereof a silicon dioxide film, two separated, relatively small gate electrodes atop the film, and an ohmic contact to the opposite surface of the semiconductor body. The character of the dielectric film is such as to produce a surface inversion layer in the portion of the semiconductor body contiguous with the film. Photosensitivity is obtained by depleting the surface inversion layer of carriers by pumping one of the gate electrodes with a large repetitive signal, such as a series of pulses, or a sinusoidal wave. The intensity of incident radiation is observed by the second gate electrode which monitors the capitance of the device. Detection may be accomplished in two ways: an integrating mode in which filling of the initially depleted channel is observed, and a compensating mode in which the pumping frequency is varied to compensate the incident radiation intensity.

In contradistinction to this previously known MOS device for light detection, the present device does not employ two metal contacts on the oxidized surface, nor a pumping signal and the relatively complex capitance monitoring circuit for detecting light intensity. Instead, by reason of a unique surface treatment of the semiconductor body prior to oxidation so as to insure a high surface state density at the semiconductor-oxide interface, and when reverse-biased to give a wide depletion region, the current through the device is a direct measure of incident photon intensity.

DESCRIPTION OF THE DRAWINGS

The invention and its objects and features will be better understood from the following more detailed description, taken in conjunction with the accompanying drawings, in which.

DESCRIPTION OF THE PREFERRED EMBODIMENTS

Figure 1:
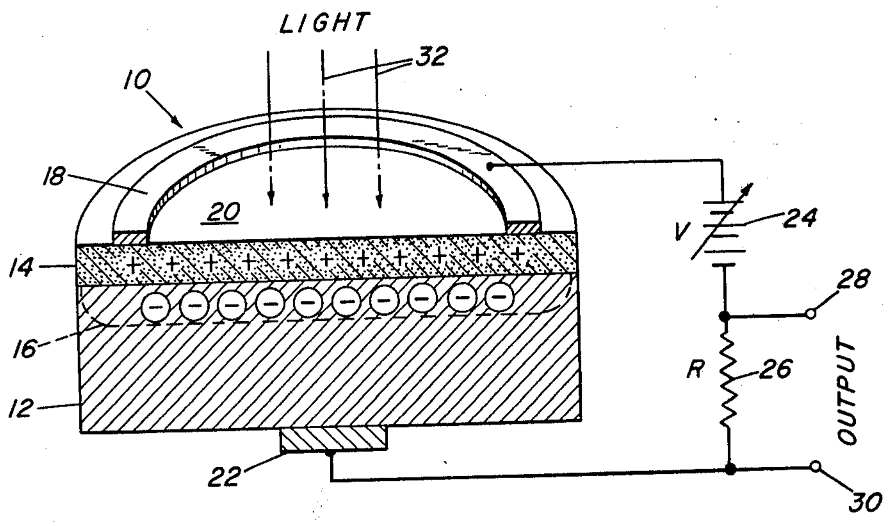
FIG. 1 shows in schematic form a MOS photodetector in one arrangement in accordance with the invention.

Referring to FIG. 1, a schematic circuit arrangement is shown connected to one form of MOS photodetector 10. The photodetector comprises a body 12 of semiconductor material, typically P-type monocrystaline silicon, on one surface of which is an insulating, optically transparent film 14, typically of silicon dioxide. By suitable treatment of the surface of the silicon body prior to oxidation, an inversion layer 16 is produced in the portion of the body 12 contiguous to the oxide film. The built-in inversion condition may be produced by suitably growing or treating the surface of the semiconductor body, for example, by treating the surface to incorporate a controlled high degree of lattice imperfection and a controlled amount of foreign atoms (impurities) in the surface region just prior to oxidation. Suitable impurities, which may be controllably introduced during the formation of the surface region, include sodium, copper, and potassium, for example, it having been found that sodium is particularly efficacious in the formation of a low resistance inversion layer. Typically, the surface region is treated so as to have a sheet resistance of the order of 100 ohms per square. Chemical-mechanical polished silicon as usually received from vendors has been found to have the necessary impurities and surface imperfections to enable deposition of the silicon dioxide film thereon without further treatment.

The silicon dioxide film may be thermally grown on the surface of the semiconductor body, or it may be deposited thereon by R. F. sputtering. In the case of thermal oxidation, dry oxygen is passed over the silicon body heated in a furnace to about 1000°C, the silicon in the film coming from the body. In the process, some of the impurities in the surface region 16 get into the dielectric film. Alternatively, the film may be deposited by R. F. sputtering of $SiO_2$ (in the form of a glass rod, for example) in an atmosphere of argon and oxygen. Typically, the film 14 is deposited (or grown) to a thickness of about 300A, although not limited to this thickness. It has been observed that film thickness in the range of 300–500A are useful over a wide range of light levels, and that it is possible to have satisfactory operation for certain light levels, with dielectric film as thin as 100A and as thick as 1000A.

The highly conductive region at the interface between the semiconductor body and the oxide film permits the front contact to be made very small. For example, the front contact may be in the form of a metal ring 18 placed atop the film 14, leaving an unobstructed area 20 within the ring over which incident photons may fall directly onto the transparent insulator 14. The device structure is completed by an ohmic or low resistance contact 22 applied to the opposite surface of the semiconductor body 12.

Like the photodiode structure itself, the circuit in which it is used, one form of which is shown in FIG. 1, is also extremely simple. The circuit consists simply of a source of direct current potential 24, the positive terminal of which is connected to front contact 18, connected in series with a resistor 26 to the back contact 22. Typical values of the voltage V are 25–50 volts and a typical resistance value is about 100 ohms. The potential developed across resistor 26 in response to the current in the device caused by light incident thereon is taken from output terminals 28 and 30.

By way of understanding the operation of the photodetector apparatus of FIG. 1, the device in the quiescent condition is reverse-biased to give a wide depletion region. Photons (represented by the vertical arrows 32) pass through the transparent silicon-dioxide layer 14 and are absorbed in the silicon 12. The photons absorbed within the depletion region excite electrons into the conduction band, leaving a hole in the valance band. These carriers move in the depletion region under the force of the electric field existing between front contact 18 and back contact 22 until the electrons reach the silicon-dioxide film and the holes reach the non-depleted region of the silicon. Those electrons reaching the insulating film, which is typically 300A thick, are transported through the insulator to reach the metal electrode 18. Electrons are conducted from where they are generated, along the surface of the semiconductor body by reason of the highly conductive N-type region provided by the above-described surface treatment, to where they are transported through the insulating film 14 to the metal contact 18. Thus, the provision of the inversion layer at the surface of the semiconductor body 12 makes possible the use of the non-obscuring metal front contact 18.

Figure 2:
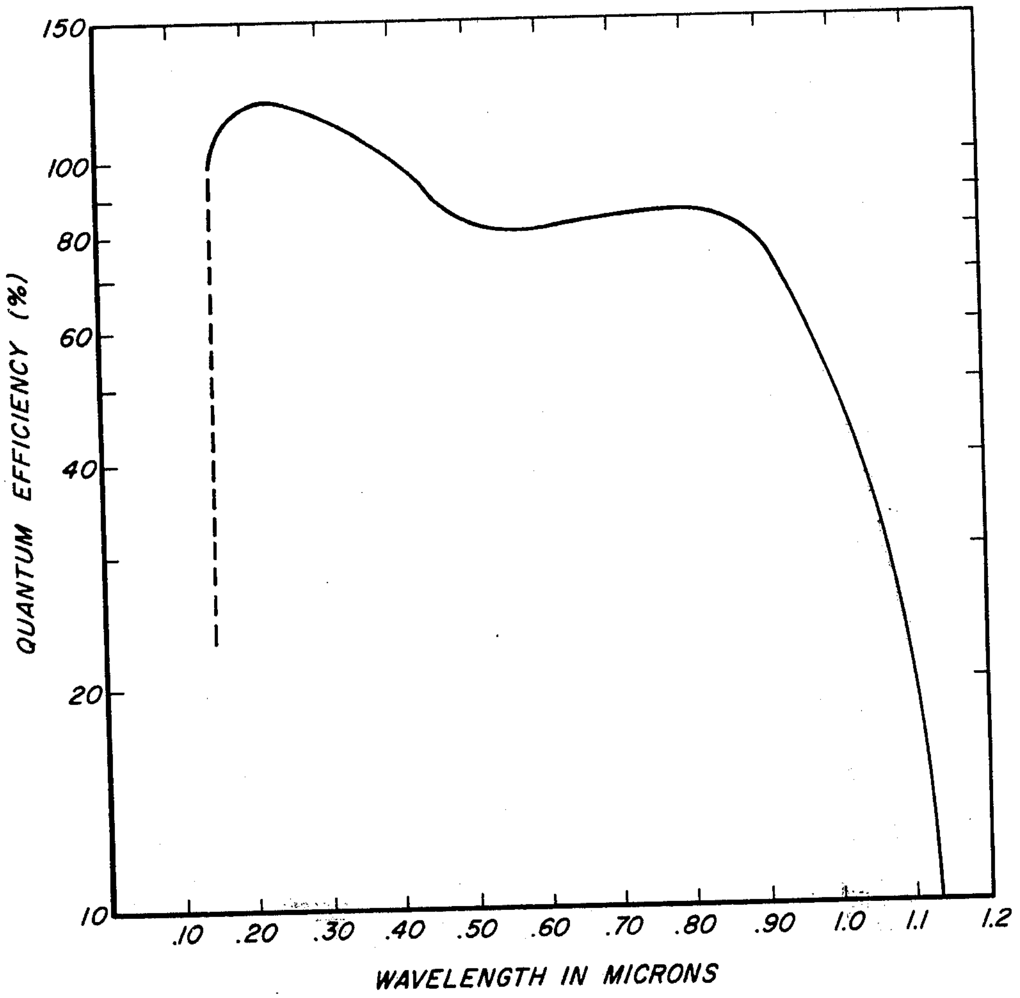
FIG. 2 is a graph showing the spectral quantum efficiency of the diode constructed according to the invention.

It will be evident from the previous paragraph that the oxide film 14 provides two critical functions: (1) an optically transmissive layer with an electrically conductive layer at the oxide-semiconductor interface, and (2) a high quality charge transporting insulator between the silicon and the front metal contact. This permits the incident radiation to fall anywhere on the silicon-dioxide layer, thereby eliminating absorption in a metalized contact layer. Thus, the entrance window consists of a silicon-dioxide layer approximately 300A thick which exhibits high optical transmission for wavelengths greater than 1700A. Consequently, the photodiode has a relatively flat quantum efficiency vs. wavelength characteristic in the spectral range from 0.9 microns to below 2000A as illustrated in FIG. 2. This response is characteristic of the semiconductor material used, namely, silicon. It is to be noted that the 10% points in the spectral response characteristic are at less than 0.20 microns out to approximately 1.1 microns, and that the quantum efficienty is in excess of 80% over the range from 0.2 to nearly 0.9 microns wavelength.

Figure 3:
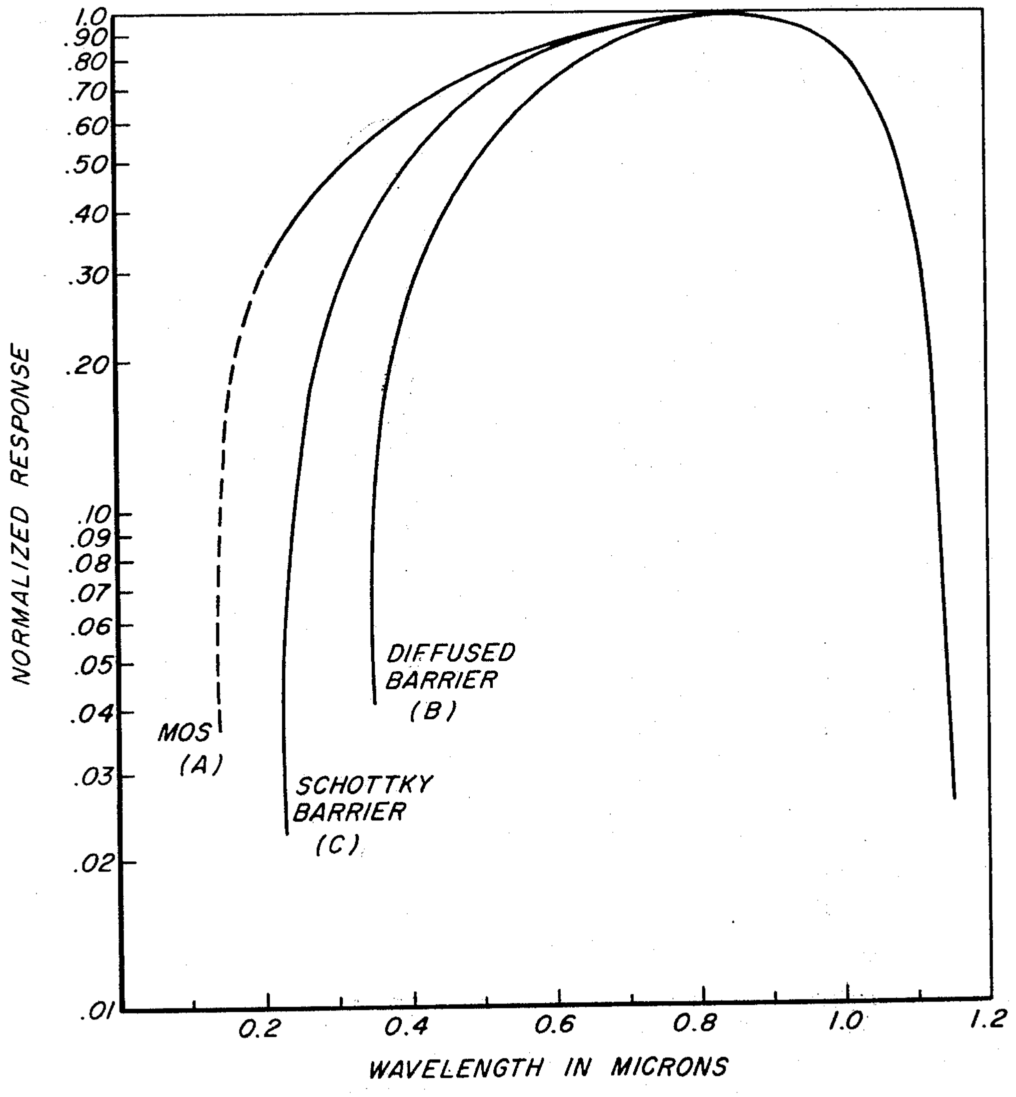
FIG. 3 is a graph showing a comparison of the normalized spectral response of a typical photodiode according to the invention with photodiodes of other types.

FIG. 3 is a series of graphs comparing the normalized response of the MOS photodiode of the invention with the best commercially available junction photodiodes. In this figure, Curve A represents the response of the photodiode according to the invention. Curve B shows the response of P-I-N diode type SGD-100A (diffused barrier), and Curve C illustrates the response of the ultraviolet-enhanced Schottky barrier diode type PIN-5UV. It is seen that the spectral response of the present photodiode is clearly superior to the other two photodiodes represented in the comparison. Although not illustrated, comparative tests have shown that the dark current and noise figure of the present photodiode are as low as in the above-mentioned commercially available photodiodes.

The principles of the invention are applicable to devices of various sizes; for example, a device of circular area 1 inch in diameter was found to exhibit a spatial variation in sensitivity of less than 5% across the 1 inch diameter. It will be recognized that the size of the device will normally be a compromise with other desired characteristics, such as speed of response. The capacity of the device limits the ultimate speed of response, and, consequently, when extremely fast response is required, the detectors must have a small area. It has been observed, for example, that a detector having a window area of 0.080 × 0.080 inch when connected in circuit with a 100 ohm load resistor had a speed of response out to 50 megahertz.

Figure 4:
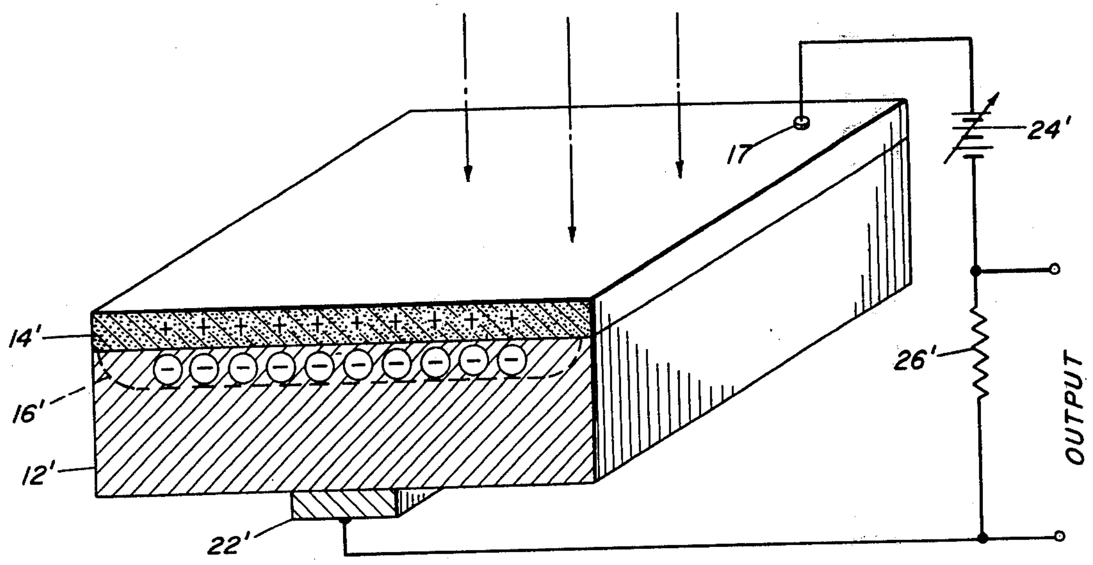
FIG. 4 shows in schematic form another embodiment of an MOS photodetector according to the invention.

An important aspect of the invention is that the configuration of the front contact may be varied to fit the particular application for the device. That is, although a ring configuration is shown in FIG. 1, the front contact may simply be a small contact dot 17 formed of a suitable metal, for example, gold, evaporated onto the silicon-dioxide layer, as shown in FIG. 4. The location of the front contact with respect to the back contact is not critical, thus allowing the front contact to be placed at any position on the insulating film as required for a particular application or packaging configuration. The construction offers the further important advantage over photodetectors of the P-N junction type that since there is no P-N junction to protect, the device is more immune to damaging radiation or surface contamination.

Although the invention has been described in terms of certain specific embodiments, it will be understood that variations may be made by those skilled in the art which likewise fall within the scope and spirit of the claims.

We claim:

1. A photodiode device comprising:

a. a semiconductor body of one conductivity type having a surface region of opposite conductivity type, said surface region constituting an inversion layer which is more highly conductive than said body of semiconductor material;
b. a dielectric film deposited over said region, said film being transparent to light;
c. a single metal electrode disposed on said film, said electrode being sufficiently small in area to leave a substantial portion of said film exposed; and
d. a separate low resistance electrode connection to the opposite surface of said semiconductor body; said photodiode being operative when reverse biased across its electrodes to have a continuous current flow therethrough which represents the degree of illumination, if any, of said dielectric film.

2. The device as defined by claim 1 wherein said surface region has a sheet resistance of the order of 100 ohms per square.

3. The device as defined by claim 2 wherein said semiconductor body is of P-type material and said inversion layer is N-type.

4. The device as defined by claim 2 wherein said metal electrode is in the form of annular ring on said dielectric film.

5. The photodiode device as defined by claim 2 wherein said metal electrode is in the form of a metal dot on said electric film.

6. A photodiode device, comprising:

a. a semiconductor body of one conductivity type having a surface region of opposite conductivity type, said surface region constituting an inversion layer which is more highly conductive than said body of semiconductor material;
b. a dielectric film deposited over said region, said film being transparent to light;
c. a single metal electrode on said film, said electrode being sufficiently small in area to leave a substantial portion of said film exposed;
d. a separate low resistance electrode connection to the opposite surface of said semiconductor body; and
e. means for providing a reverse bias potential across the electrodes of said device;

whereby said device exhibits a continuous current flow therethrough which represents the degree of illumination, if any, of said dielectric film.

7. The device as defined by claim 6 wherein said inversion layer has a sheet resistance of the order of 100 ohms per square.

8. The device as defined in claim 7 wherein said semiconductor body is of P-type material and said inversion layer is N-type.

9. The device as defined by claim 7 wherein said metal electrode is in the form of an annular ring on said dielectric film.

10. The device as defined by claim 8 wherein said metal electrode is in the form of a metal dot on said dielectric film.

* * * * *

UNITED STATES PATENT OFFICE
CERTIFICATE OF CORRECTION

PATENT NO. : 3,911,465
DATED : October 7, 1975
INVENTOR(S) : Norman A. Foss and Samuel A. Ward It is certified that error appears in the above-identified patent and that said Letters Patent are hereby corrected as shown below:

Column 1, line 15, "parts" should be --pairs--.

Column 5, line 28, "electric" should be --dielectric--.

Signed and Sealed this

*twenty-third* Day of *March 1976*

[SEAL]

*Attest:*

RUTH C. MASON
*Attesting Officer*

C. MARSHALL DANN
*Commissioner of Patents and Trademarks*